United States Patent
Plummer et al.

[11] Patent Number: 6,061,372
[45] Date of Patent: May 9, 2000

[54] TWO-LEVEL SEMICONDUCTOR LASER DRIVER

[75] Inventors: William T. Plummer, Concord; Marc Thompson, Watertown; Douglas S. Goodman, Sudbury; Peter P. Clark, Boxborough, all of Mass.

[73] Assignee: Polaroid Corporation, Cambridge, Mass.

[21] Appl. No.: 09/107,870

[22] Filed: Jun. 30, 1998

Related U.S. Application Data

[60] Provisional application No. 60/051,256, Jun. 30, 1997.

[51] Int. Cl.⁷ .................................. H01S 3/00; H01S 3/13
[52] U.S. Cl. ............................. 372/38; 347/247; 372/30; 372/31
[58] Field of Search .................. 372/38, 30, 31; 347/247

[56] References Cited

U.S. PATENT DOCUMENTS

| | | | |
|---|---|---|---|
| 4,766,597 | 8/1988 | Olshansky | 372/44 |
| 5,200,297 | 4/1993 | Kelly | 430/253 |
| 5,355,303 | 10/1994 | Ferla et al. | 346/107 |
| 5,444,728 | 8/1995 | Thompson | 372/38 |
| 5,473,153 | 12/1995 | Araki et al. | 250/205 |
| 5,513,165 | 4/1996 | Ide et al. | 369/116 |
| 5,859,862 | 1/1999 | Kazuhiko et al. | 372/38 |

*Primary Examiner*—Frank G. Font
*Assistant Examiner*—Armando Rodriguez
*Attorney, Agent, or Firm*—Thomas P. Grodt

[57] ABSTRACT

Disclosed is a two-level current driver suitable for driving a semiconductor laser for printing applications, the laser driver including a primary power source for producing a first current pulse of amplitude $I_1$ and of duration $T_2$, a secondary power source for producing a second current pulse of amplitude $I_2$ and of duration $T_1$, means for combining the outputs of the power sources, and sensing means for detecting the current pulse output from the primary power source.

2 Claims, 7 Drawing Sheets

TWO-LEVEL SEMICONDUCTOR LASER DRIVER

CROSS REFERENCE TO RELATED APPLICATION

This case is a continuation of Provisional Application serial No. 60/051,256 filed on Jun. 30, 1997.

BACKGROUND OF THE INVENTION

1. Field of the Invention

This invention in general relates to the field of laser printing systems and, more specifically, to an optical printhead which produces gray-scale images comprising printing elements of more than one size.

2. Description of the Prior Art

The use of lasers, especially semiconductor lasers, in optical printheads wherein pulses of optical radiation are utilized to produce an image or graphics, is well known. In a typical application, an image is produced by the scanning of the optical radiation across a suitable receptor medium. By way of example, the image may comprise alphanumeric characters or a graphical image formed either in gray scale or in color.

A laser printing system may be configured to produce a gray-scale image by imaging pixels comprised of dark and light regions, such as in halftone recording methods. As disclosed in the prior art, a halftone pixel can be comprised of one or more clusters of individual print or display units commonly referred to as "pels." Although pels are commonly provided in a single fixed size, the resolution of the printed or displayed image may be improved by using pels of more than one size. For example, in U.S. Pat. No. 5,355,303 "Printing apparatus," issued to Feria et al. there is disclosed a printing apparatus in which an individual 90 $\mu m \times 90 \mu m$ gray-scale pixel is comprised of both 30 $\mu m$ wide pels and 5 $\mu m$ wide pels.

In some applications, the laser printing system is used to image onto a binary thermal imaging medium such as that described in, for example, U.S. Pat. No. 5,200,297 "Laminar thermal imaging mediums, containing polymeric stress-absorbing layer, actuable in response to intense image-forming radiation," issued to Kelly, which discloses a laminar thermal imaging media comprising a pair of sheets at least one of which is transparent and responding to incident thermal energy, such as that provided by optical laser radiation. When using a binary imaging medium, the process of imaging requires that, to produce a pel, the intensity of the imaging laser beam at the medium be above a preestablished threshold but remain below a maximum level so as not to produce burnout.

Typically, the output distribution of an imaging laser beam is Gaussian. To achieve desired intensity at a particular pel size, the beam must be focused upon the medium within a certain tolerance. Moreover, because of different spatial distributions and thermal considerations, the exposure requirements will differ for different pel sizes. One approach is to use a different current driver for each type of pel used in the imaging pixel. This, however, adds additional cost and complexity to the device.

While the art describes a variety of devices that utilize laser devices for printing, there remains a need for improvements that offer advantages and capabilities not found in presently available instruments, and it is a primary object of this invention to provide such improvements.

It is another object of the present invention to provide a printhead laser driver current source which provides an output waveform suitable for optimally producing pels of more than one size.

It is another object of the invention to provide such a current source which will lessen the tolerance requirements on the focusing mechanisms.

Other objects of the invention will be obvious, in part, and, in part, will become apparent when reading the detailed description to follow.

SUMMARY OF THE INVENTION

The present invention results from the observation that a laser current driver having a nonmonotone output waveform will yield a laser radiation output suitable for producing printing elements of more than one size. A two-level semiconductor laser driver comprises primary and secondary power sources coupled to the laser, means for combining the outputs of the primary and secondary power sources, and a current sensor for monitoring the output of the primary power source.

Other features of the invention will be readily apparent when the following detailed description is read in connection with the drawings.

BRIEF DESCRIPTION OF THE DRAWINGS

The structure and operation of the invention, together with other objects and advantages thereof, may best be understood by reading the detailed description to follow in connection with the drawings in which unique reference numerals have been used throughout for each element and wherein.

DESCRIPTION OF THE PREFERRED EMBODIMENTS

Figure 1:
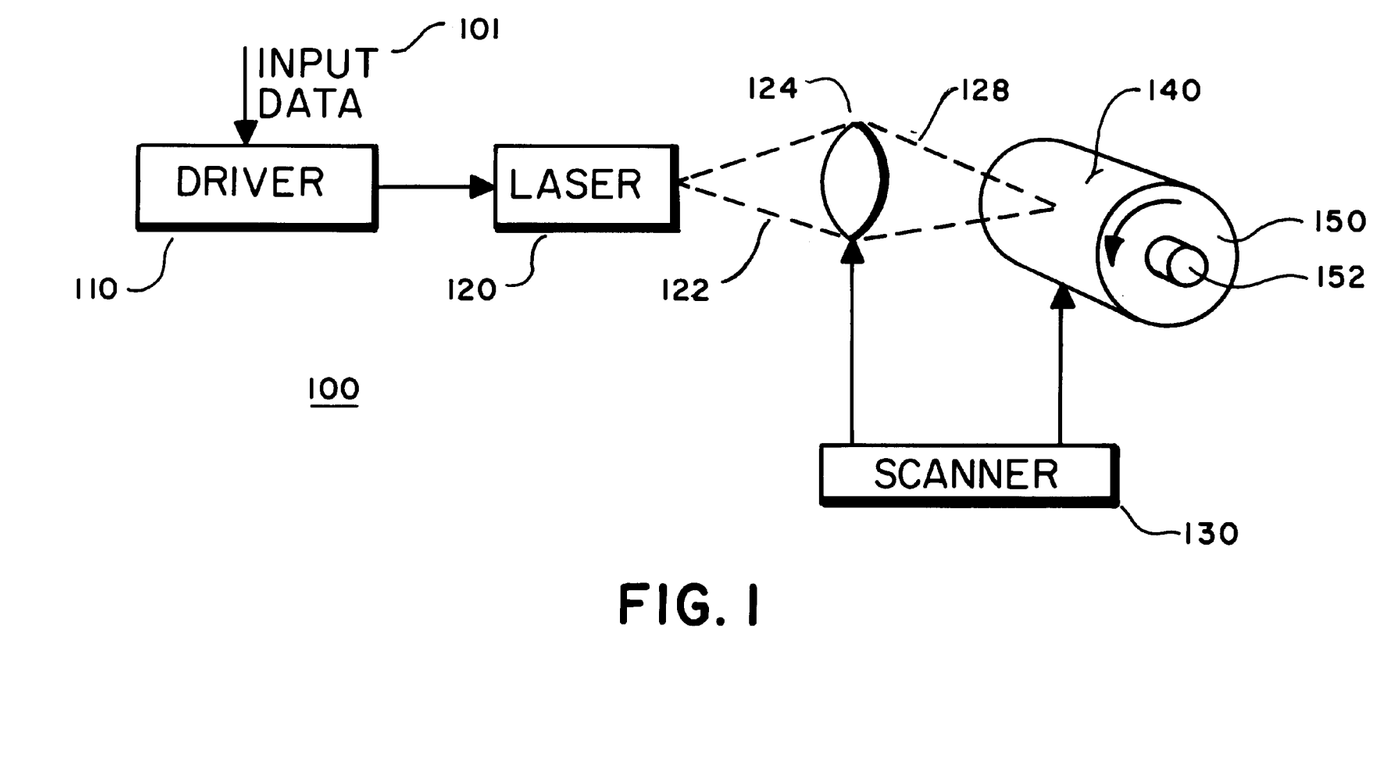
FIG. 1 is a simplified diagrammatic view of a laser printing system comprising a laser current driver in accordance with the present invention as used in the printing of an image onto a photosensitive medium.

There is shown in FIG. 1 a laser printing system 100, in accordance with the present invention, comprising a laser current driver 110 supplying power to a laser assembly 120 which provides optical radiation 122 for imprinting an image on a photosensitive recording medium 140 in response to a set of input data 101. An optical system, represented by a lens 124, serves to focus optical radiation 122 onto medium 140 as one or more laser beams 128. By way of example, medium 140 may be secured to a cylindrical surface 150 which is rotatable about an axis 152. A scanning apparatus 130 serves both to adjust lens 124 to maintain laser beam 128 in focus on medium 140 and to translate lens 124 in synchronism with the rotation of drum 150 whereby laser beam 128 is scanned along medium 140 to produce the desired image. When laser printing system 100 is used in the medical arts, for example, input data 101 may be obtained by instrumentation such as an x-ray unit, a CAT scanner, a magnetic resonance imager, ultrasound equipment, or the like. Alternatively, input data 101 need not be provided in real time but may be an analog or digital image which is retrievably stored using optical or magnetic tape or disk, solid-state memory, or other storage methods.

Figure 2:
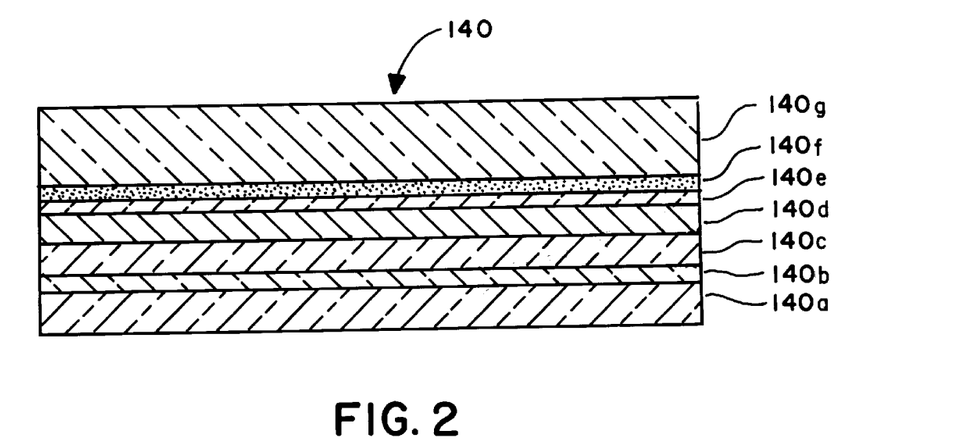
FIGS. 2 and 3 are a diagrammatic cross-sectional view of a thermal imaging laminar medium, unexposed and exposed respectively, suitable for use in the laser printing system of FIG. 1.
Figure 3:
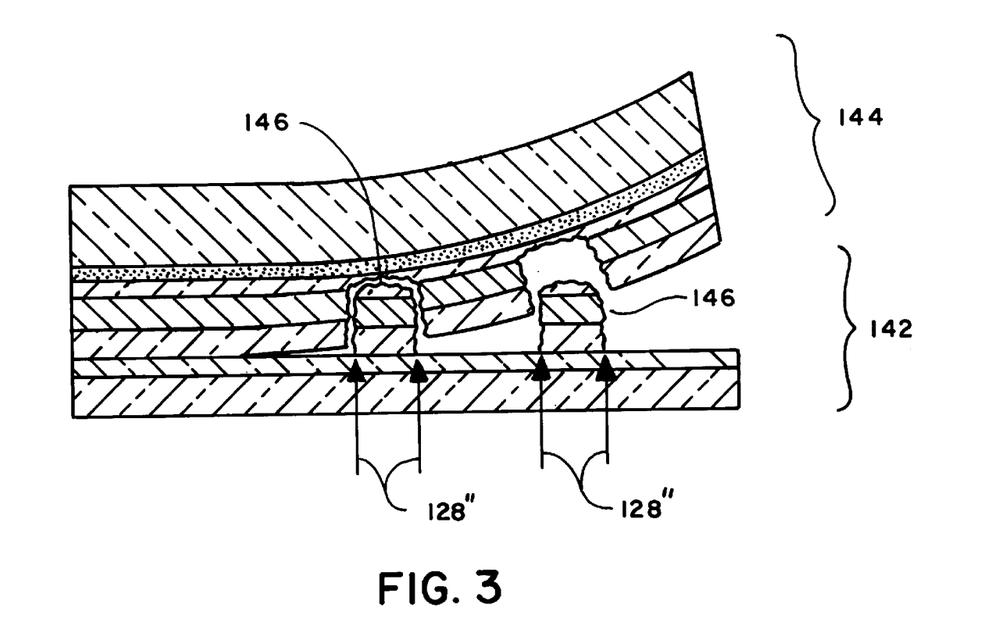

In a preferred embodiment, the image is produced by using a high-resolution, binary thermal imaging medium that forms images in response to intense imaging radiation such as laser radiation. A suitable medium is laminar comprising a pair of adjacent sheets of which the first sheet is transparent to the incident imaging radiation. Between the two sheets is provided a layer of image-forming material which is more firmly attached to the second sheet than to the first, transparent sheet. When the imaging medium is exposed to an imaging pattern of radiation, exposed portions of the image-forming material become more firmly attached to the first sheet than to the second sheet. Subsequently, when the two sheets are physically separated, the exposed portions of image-forming material remain with the first sheet and the unexposed portions of image-forming material are removed with the second sheet. By way of example, the cross-sectional view of a preferred photosensitive recording medium 140 suitable for use with the present invention is shown unexposed in FIG. 2, and in the process of separation after exposure in FIG. 3, and comprises, in order:

1) a first sheet-like web material 140a, substantially transparent to laser beam 128, represented by beams 128' and 128," and having a surface zone of polymeric material 140b, where polymeric material 140b is heat-activated in response to beams 128' and 128";

2) a thermoplastic layer 140c having a degree of cohesivity in excess of its adhesivity for polymeric material 140b;

3) a layer of porous or particulate image-forming substance 140d on thermoplastic layer 140c, where thermoplastic layer 140c has a degree of cohesivity in excess of its adhesivity for image-forming substance 140d;

4) a release layer 140e which undergoes adhesive failure in exposed regions;

5) an adhesive layer 140f where, in exposed regions, release layer 140e has a lesser degree of adhesion to either adhesive layer 140f or to image-forming substance 140d than: i) the adhesion of thermoplastic layer 140c to polymeric material 140b, and ii) the adhesion of thermoplastic layer 140c to image forming substance 140d; and 6) a second sheet-like web material 140g laminated to image forming-substance 140d by means of adhesive layer 140f.

The preferred photosensitive recording medium 140 functions by absorbing laser imaging radiation from laser beam 128 at or near the interface formed by polymeric material 140b and thermoplastic layer 140c. The absorbed radiation produces, by conversion, thermal energy of sufficient intensity to heat activate polymeric material 140b rapidly. As polymeric material 140b cools, it preferentially attaches to thermoplastic layer 140c. Upon separation of first sheet 142 from second sheet 144, exposed portions of thermoplastic layer 140c, image-forming substance 140d, and release layer 140e remain with second sheet 144, as indicated at 146. A more detailed description of a medium material preferred from the standpoint of producing an image having desired durability is found in U.S. Pat. No. 5,155,003 "Thermal imaging medium," issued to Chang and assigned to the assignee of the present invention.

Figure 4:
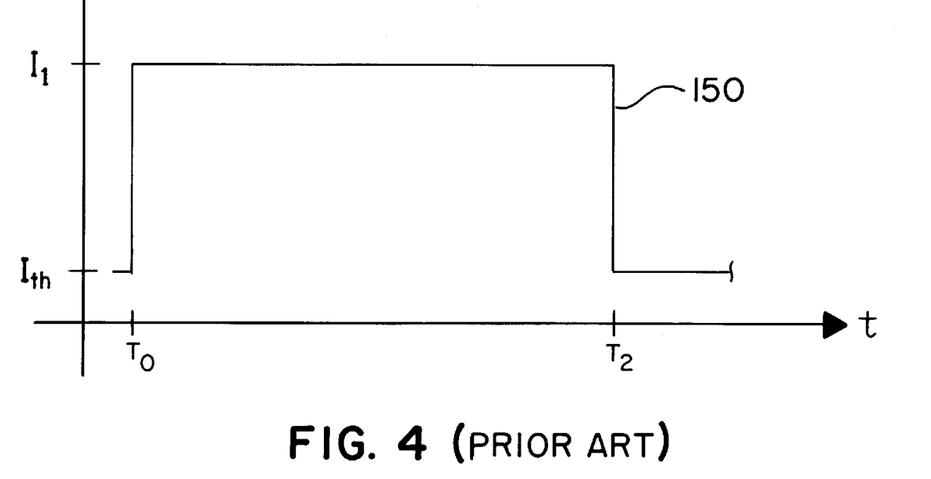
FIG. 4 is a timing diagram representing the input current waveform used in driving a conventional laser print head.

A pel is produced in a binary medium when an appropriate amount of incident radiation is received and separation of the imaging layer occurs. The graph of FIG. 4 is a typical monotone pulse current waveform 150 provided to a conventional writing laser as a function of time. With an input of waveform 150, the resultant output power of a driven laser is generally Gaussian in form. To produce an acceptable pel, the power delivered to the desired portion of imaging medium must exceed a threshold level, so as to achieve the proper peak temperature in the corresponding volume of image-forming substance, for a certain quantitative amount, but not reach or exceed a burnout level. This power varies as a function of the size of pel used in writing as well as the particular medium written upon.

In general, the power pulse level required for a small pel is greater than the power pulse level required for a large pel. In a conventional laser printing system, the power level would be set high for the small pel, as writing of the small pel is more critical, and the same level would be used for the large pel as well. However, this has the disadvantage that the extra power is wasted and needs to be disposed of. Also, running the laser at a higher level than necessary shortens the life of the unit. This would indicate that, to optimize writing in a laser printing system using more than one size pel requires more than one current driver for each pel size used. However, this is not a practical alternative as yet a different current pulse would be required when changing to a different imaging medium. What is indicated is a current pulse of varying power level which is optimized for both large and small pels, and is adjustable. Adjustability would also allow an operator to fine tune the imaging system prior to use.

Figure 5:
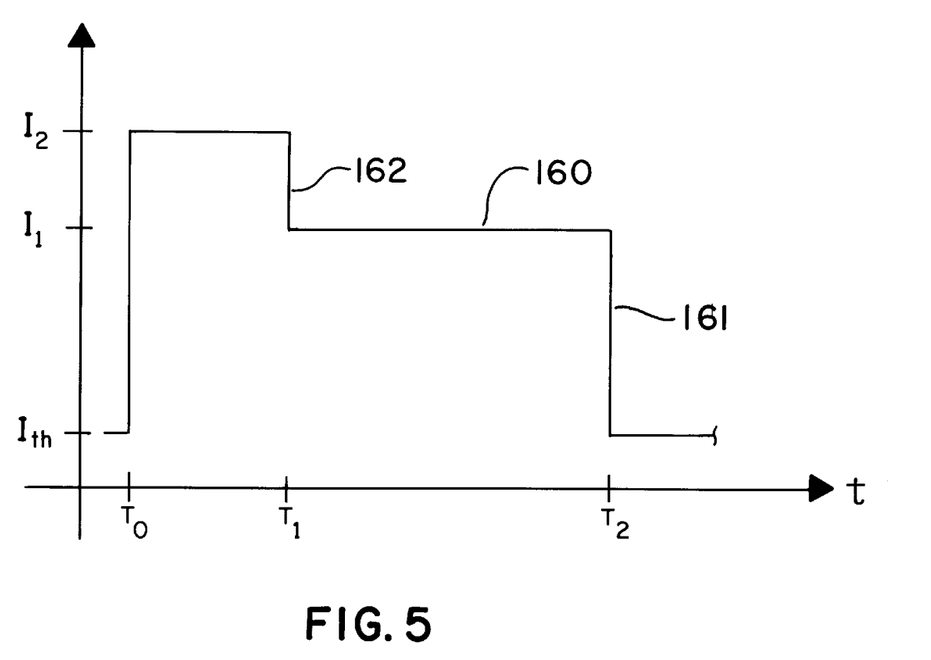
FIG. 5 is a timing diagram illustrating the output current waveform produced by the laser driver of FIG. 1.

FIG. 5 shows a two-level waveform 160, in accordance with the present invention, which is optimized for at least two pulse sizes. Two-level waveform 160 is comprised of a primary waveform 161, having a peak primary current level $I_1$, and a secondary waveform 162, having a peak secondary current level $I_2$. Laser threshold current level is represented by threshold current $I_{th}$. For an imaging medium as described above, and for large and small pels sizes of, respectively, 30 μm and 5 μm, primary waveform 161 output power level is approximately 141 mA, and secondary waveform 162 output power level is approximately 109 mA above primary waveform 161. In a preferred embodiment, 10 nsec $\leq (T_1-T_0) \leq$ 1000 ns and $(T_2-T_1) >$ 20 nsec, with rise time at $T_0$ and fall time at $T_2$ of less than 15 nsec.

Figure 6:
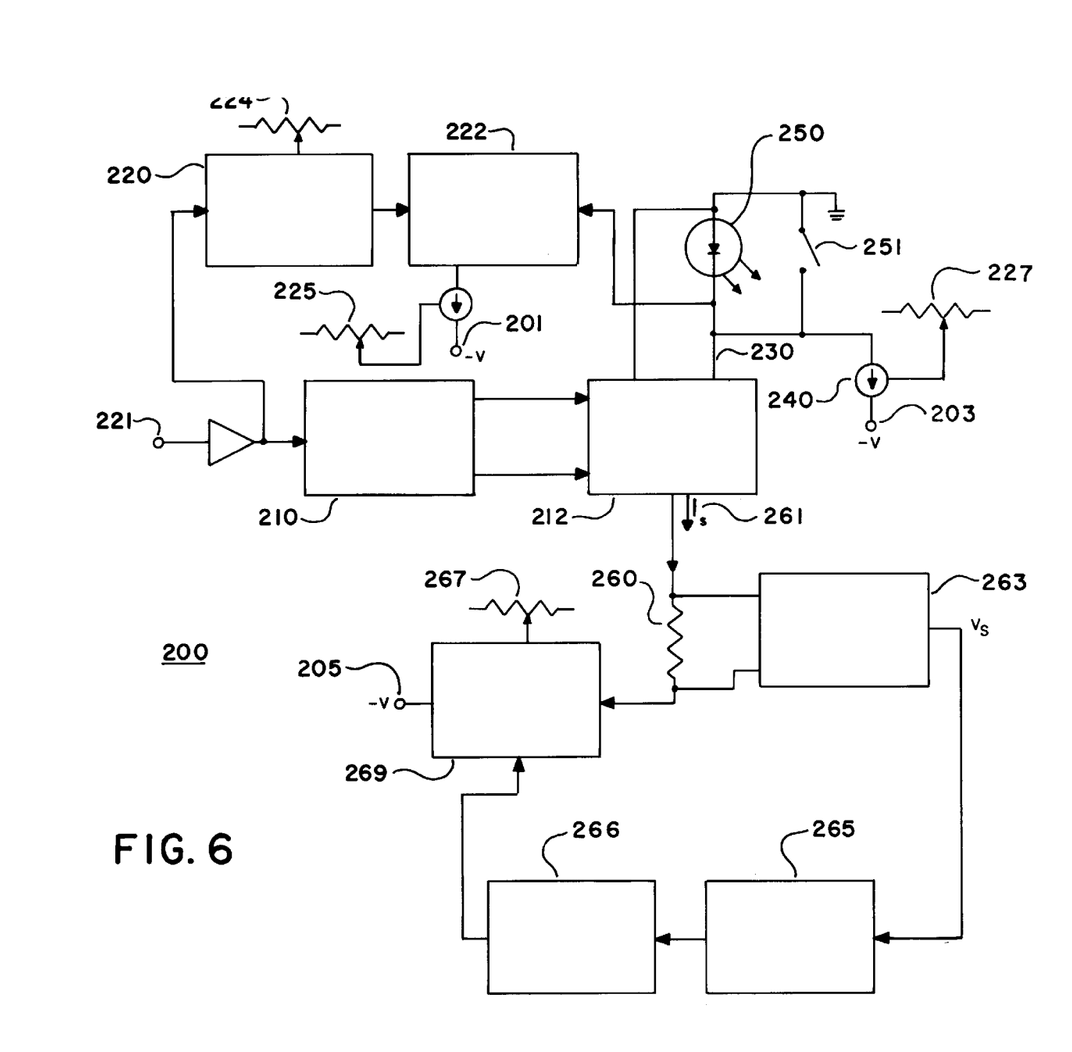
FIG. 6 is a simplified block diagram of the laser driver of FIG. 1 comprising primary and secondary current sources, primary and secondary switching arrays, and power sources.

Two-level waveform 160 can be produced by a laser driver circuit 200, shown in block diagram form in FIG. 6. Laser driver circuit 200 comprises a primary current source 210 and a secondary current source 220. Primary current source 210 is independent of secondary current source 220 but both outputs are preferably connected in parallel to a low inductance microstrip line 230 whereby a composite pulse is produced which drives a laser 250. A bypass switch 251 is provided across laser 250. In a preferred embodiment, a voltage source (−V) of —12 volts, is provided at 201, 203, and 205.

Primary current source 210 provides primary waveform 161 output current to laser 250 by means of a primary switching array 212. Secondary current source 220 provides secondary waveform 162 output current to laser 250 by means of a secondary switching array 222. Secondary current source 220 is triggered by the low-to-high transition of an input TTL signal provided at an input port 221. The pulse width for secondary current source 220 is set by means of a potentiometer 224, and the current level is set by means of a potentiometer 225. Laser threshold current level is set by means of a potentiometer 227.

For a TTL signal level of logic "HIGH," a threshold current 240 is supplied to laser 250 is the level set by potentiometer 227, and no current is supplied by either primary current source 210 or secondary current source 220. When the TTL signal at input port 221 makes a transition, primary switching array 212 switches on and sends primary waveform 161 to laser 250. Simultaneously, secondary switching array 222 switches on and sends secondary waveform 162 to laser 250. Primary switching array 212 provides a sensing current 261 ($I_s$) to a sensing load resistor 260 for detection by a differential amplifier 263. A sensing voltage $V_s$ is subsequently passed through a loop filter 265 and a pulse width modulator 266, and onto a power convertor 269. The level of primary current source 210 is set by means of a potentiometer 267.

Figure 7:
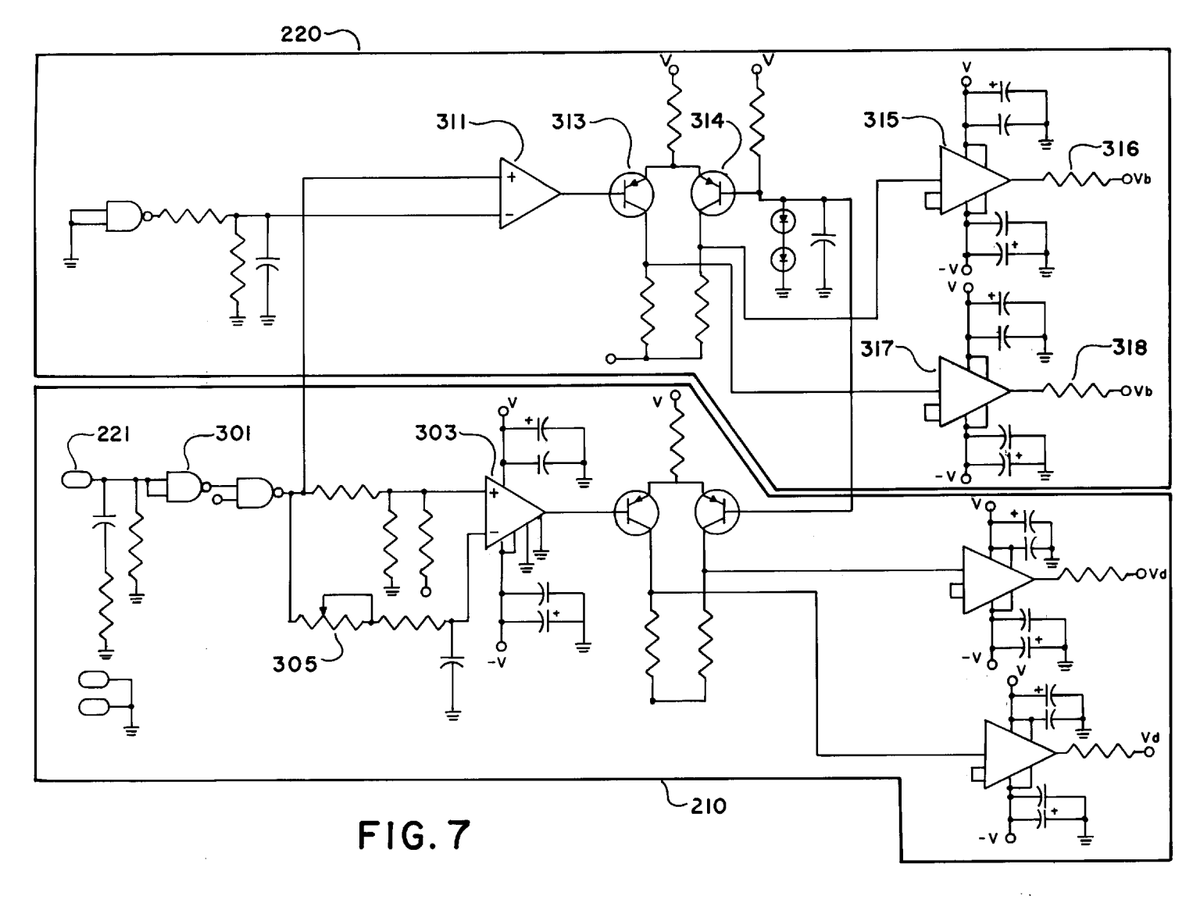
FIG. 7 is a circuit diagram of the primary current source and the secondary current source of FIG. 6.

Operation of laser driver circuit 200 can be explained with reference to FIG. 7 in which primary current source 210 and secondary current source 220 are shown in greater detail. The input TTL signal is buffered by gate 301. Primary current source 210 comprises a comparator circuit 303 configured as a monostable device. The output of comparator circuit 303 transitions to "HIGH" simultaneously with the input TTL signal, and transitions "LOW" at a subsequent time determined by the setting of potentiometer 305, preferably 10 to 1000 nsec.

The primary switching path for secondary waveform 162 output current supplied to laser 250 is through comparator 311, switching transistors 313 and 314, and buffers 315 and 317. Transistors 313 and 314 convert the TTL-level signal from comparator 311 to suitable voltage levels. The switching voltage of the collectors of transistors 313 and 314 switch from −7 volts to approximately −5 volts when the input TTL signal changes state. Buffers 315 and 317 provide sufficient drive current to drive secondary switching array 222 such that switching occurs within the desired rise time and fall time. Series resistors 316 and 318 reduce to an acceptable level the power dissipated in buffers 315 and 317 respectively.

Figure 8:
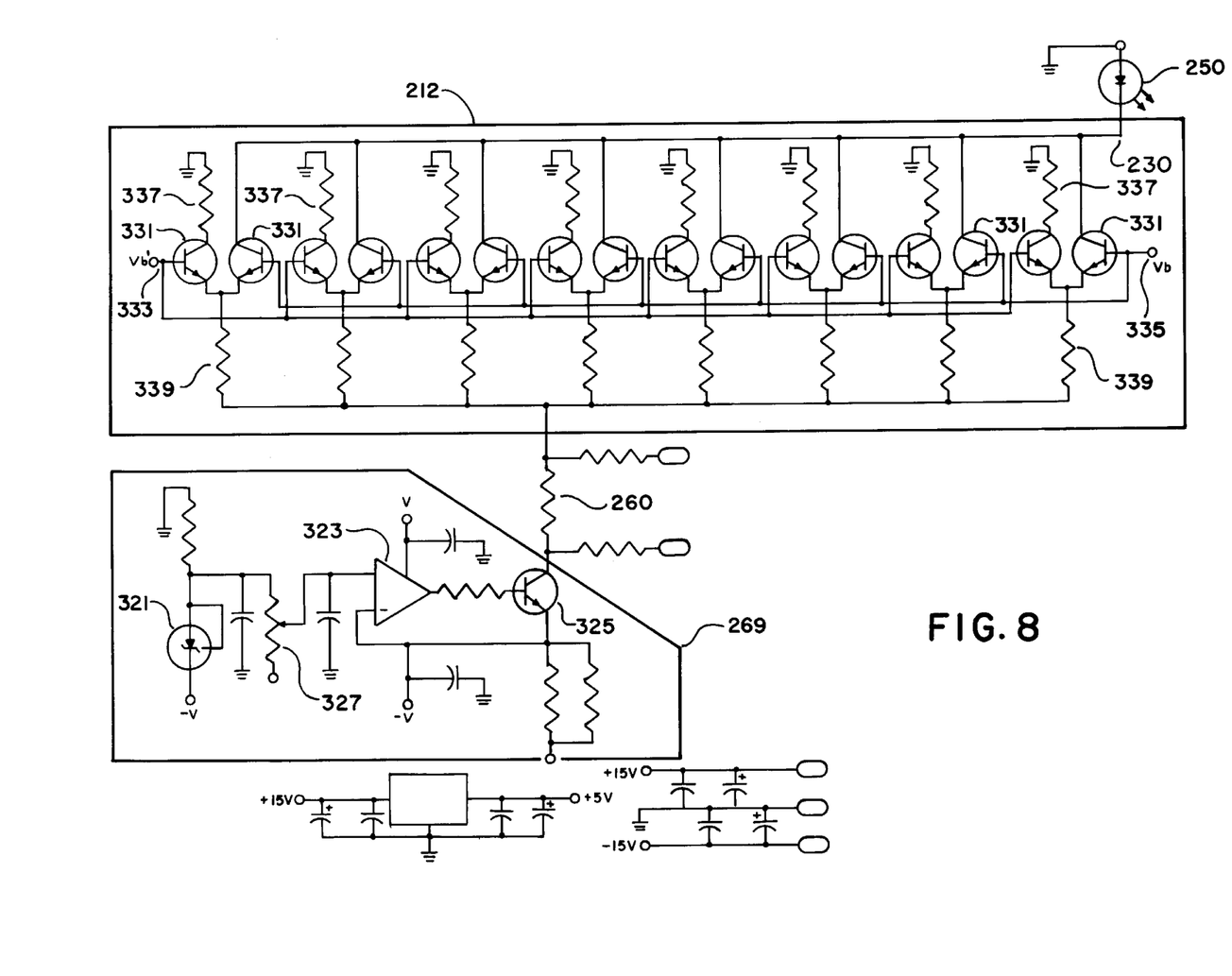
FIG. 8 is a circuit diagram of the primary switching array and the power convertor of FIG. 6; and, FIG. 9 is a circuit diagram of the secondary switching array, secondary current level setting circuit, and threshold current source of FIG. 6.

As best seen in FIG. 8, power convertor 269 comprises a voltage reference 321, operational amplifier 323, and transistor 325. The current output of power convertor 269 can be adjusted from 0 to 2000 mA by means of a potentiometer 327. The voltage measured across sensing load resistor 260 provides a means of measuring this current output.

The current output from power convertor 269 is sent to primary switching array 212 which comprises a plurality of switching transistors 331 connected in parallel. In a preferred embodiment, switching transistor comprises an MPQ2222A transistors with a minimum rated $f_T$ of 200 MHz. Accordingly, the intrinsic switching time of each array element is only a few nanoseconds. By using a plurality of small devices in parallel, as in the present invention, the effects of inductance are minimized and power handling capability remains high. In comparison, if a single large switching device were used, switching speed would be compromised by package inductance (e.g., approximately 10 nH per device pin). The configuration shown has the effect of several smaller inductances in parallel, so that the effective switching inductance is less than 2 nanoHenries. As is known to one skilled in the relevant art, thermal resistance is inversely proportional to the surface area of the transistor packages, to a first-order approximation. For multiple devices in parallel, this surface area is greater than that of a single power device, and the necessary power can be provided without need for a heat sink, by which power-handling capability is increased.

One side of primary switching array 212 is "ON" at a given time, and is controlled by array drive signals 335 ($V_b$) and 333 ($V_b^*$). The transition times of switching transistors 331 are very rapid, and are limited by the amount of current provided by power convertor 269. Collector resistors 337, preferably 15 Ω, dissipate power so that switching transistors 331 are not thermally stressed. Emitter resistors 339, preferably 10 Ω, serve to split current equally among each switching transistor 331 pairs. The collectors of switching transistors 331 on the side of the cathode of laser 250 are electrically connected to low inductance microstrip line 230 which runs to edge of a printed circuit board or other mounting means (not shown). At the board edge this microstrip is joined to a low-inductance coaxial cable which connects to laser 250. By maintaining the low inductance of this switching path, faster current switching rise times are realized.

The wiring on the printed circuit board preferably comprises microstrip lines so as to keep path inductance low and to maintain fast transient response times without ringing. Assuming that parasitic capacitances are not important, and assuming a maximum transient voltage $\Delta v_t$ tolerated by switching transistors 331, an upper bound for allowable inductance size is found by:

$$L_p < \frac{\Delta v_t}{\frac{di}{dt}}$$

For an allowable transient voltage of 0.5 V, with a 2A rise time of 20 ns, the maximum allowable inductance value is 5 nH. This design choice assures that the transient voltage will not significantly affect operation of switching transistors 331. Secondary switching array 222, shown in greater detail in FIG. 9, comprises switching transistors 341, such as MPQ2222A, connected in parallel. Switching transistors 341 are controlled by array drive signals 345 ($V_d$) and 343 ($V_d^*$). Because less current is switched by secondary switching array 222 than is switched by primary switching array 212, fewer switching transistors 341 are required. The level of secondary waveform 162 output current supplied to laser 250 at port 226 is adjustable from 0 to 500 mA by means of potentiometer 225 in secondary current level setting circuit 252. The level of threshold current 240 supplied to laser 250 by a threshold current source 242 is also adjustable from 0 to 500 mA, and is set by means of potentiometer 227.

Figure 9:
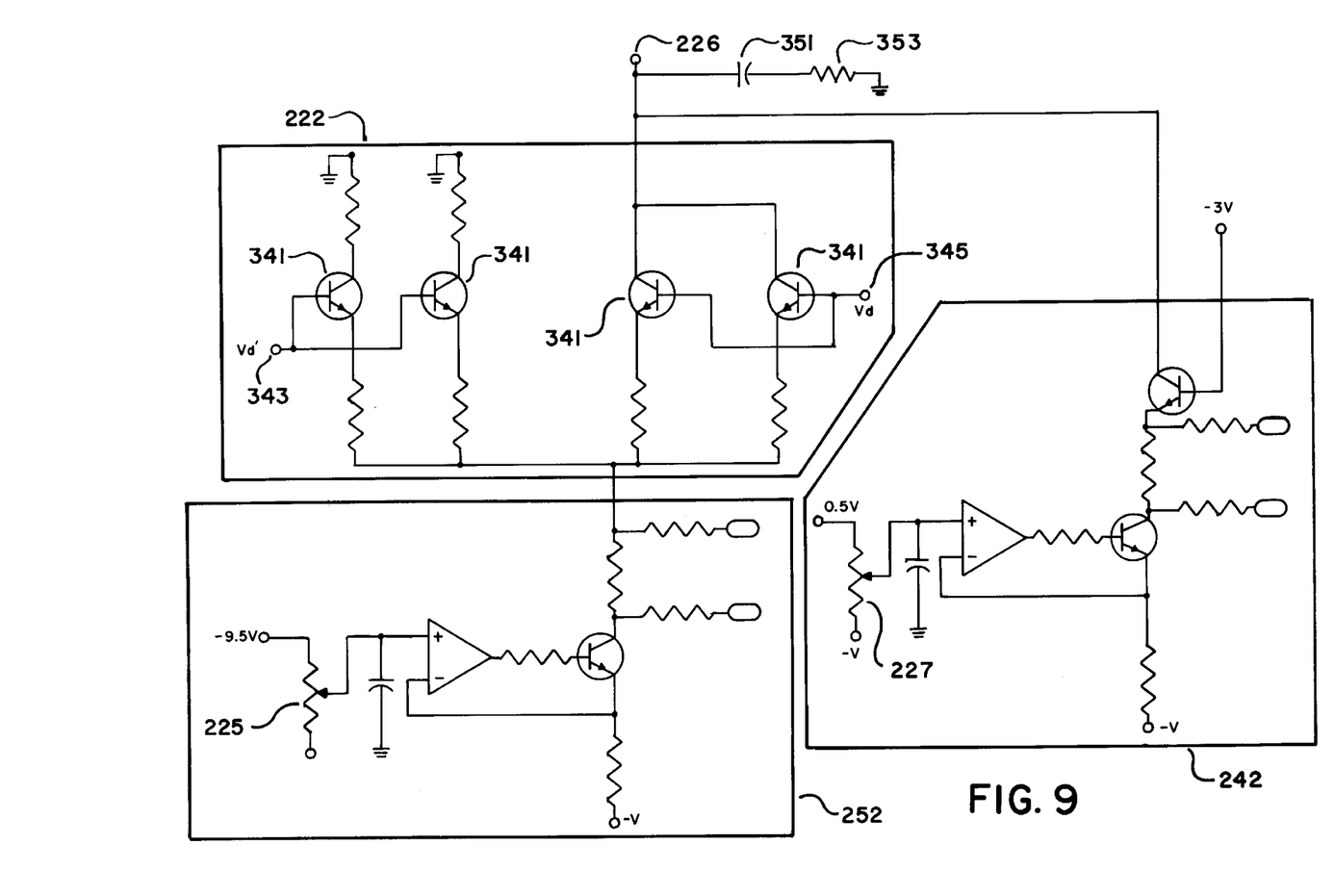

The resonant circuit formed by the inductance of the coaxial cable connected to laser 250 and the internal package inductance of laser 250 can be damped by means of a capacitor 351, preferably about 1000 pF, in series with a resistor 353, preferably about 8.2 Ω. This configuration is suitable for an application in which laser 250 comprises an "ON" resistance of about 0.5 Ω and is driven at about 1.2 watt.

While the invention has been described with reference to particular embodiments, it will be understood that the present invention is by no means limited to the particular constructions and methods herein disclosed and/or shown in the drawings, but also comprises any modifications or equivalents within the scope of the claims.

What is claimed is:

1. A two-level current driver suitable for driving a semiconductor laser for printing applications, said current driver comprising:

a primary power source for producing a first current pulse of amplitude $I_1$ and of duration $T_2$, said primary power source electrically coupled to the semiconductor laser;

a secondary power source for producing a second current pulse of amplitude $I_2$ and of duration $T_1$, said secondary power source electrically coupled to the semiconductor laser;

means for combining said first current pulse and said second current pulse whereby a composite current pulse is produced; and sensing means for detecting said first current pulse, such that the semiconductor laser optimally produces individual print or display units of more than one size when powered by said composite current pulse.

2. The current driver of claim 1 wherein said power source comprises a current source and a switching array.

* * * * *